(12) United States Patent
Blanchet et al.

(10) Patent No.: US 7,875,313 B2
(45) Date of Patent: Jan. 25, 2011

(54) METHOD TO FORM A PATTERN OF FUNCTIONAL MATERIAL ON A SUBSTRATE USING A MASK MATERIAL

(75) Inventors: Graciela Beatriz Blanchet, Wilmington, DE (US); Hee Hyun Lee, Wilmington, DE (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 952 days.

(21) Appl. No.: 11/784,067

(22) Filed: Apr. 5, 2007

(65) Prior Publication Data

US 2008/0248205 A1 Oct. 9, 2008

(51) Int. Cl.
*B05D 1/32* (2006.01)
(52) U.S. Cl. ..................... 427/282; 427/272
(58) Field of Classification Search ................ 427/589, 427/272, 259, 282; 134/1.2, 1.3, 902; 156/247
See application file for complete search history.

(56) References Cited

U.S. PATENT DOCUMENTS

| | | | |
|---|---|---|---|
| 3,532,540 A * | 10/1970 | Janning et al. | 430/345 |
| 4,277,538 A | 7/1981 | Beckmann et al. | |
| 4,414,275 A * | 11/1983 | Woods | 428/352 |
| 5,512,131 A * | 4/1996 | Kumar et al. | 438/738 |
| 5,937,758 A * | 8/1999 | Maracas et al. | 101/327 |
| 6,040,110 A * | 3/2000 | Shirai et al. | 430/258 |
| 6,180,239 B1 | 1/2001 | Whitesides et al. | |
| 6,309,580 B1 | 10/2001 | Chou | |
| 6,518,168 B1 | 2/2003 | Clem et al. | |
| 6,638,864 B2 * | 10/2003 | Toyoda et al. | 438/690 |
| 6,860,956 B2 * | 3/2005 | Bao et al. | 156/232 |
| 6,887,332 B1 | 5/2005 | Kagan et al. | |
| 6,911,385 B1 | 6/2005 | Haubrich et al. | |
| 2003/0047535 A1 | 3/2003 | Schueller et al. | |
| 2003/0166814 A1 | 9/2003 | Sparrowe et al. | |

(Continued)

FOREIGN PATENT DOCUMENTS

EP   1 193 056 A1   4/2002

(Continued)

OTHER PUBLICATIONS

Donzel, C. et al., "Hydrophilic Poly(Deimthylsiloxane) Stamps for Microcontact Printing", Advanced Materials, Wiley VCH, Weinheim, DE, vol. 13, No. 15, Aug. 3, 2001, pp. 1164-1167, XP001129646 ISSN: 0935-9648, Figure 1.

(Continued)

*Primary Examiner*—Timothy H Meeks
*Assistant Examiner*—Tabassom Tadayyon Eslami
(74) *Attorney, Agent, or Firm*—Thomas H. Magee (57) ABSTRACT

The invention provides a method to form a pattern of functional material on a substrate for use in electronic devices and components. The method uses a stamp having a relief structure to transfer a mask material to a substrate and form a pattern of open area on the substrate. The functional material is applied to the substrate in at least the open area. Contact of an adhesive material to an exterior surface opposite the substrate and separation of the adhesive from the substrate forms the pattern of functional material on the substrate. The method is suitable for the fabrication of microcircuitry for electronic devices and components.

29 Claims, 3 Drawing Sheets

U.S. PATENT DOCUMENTS

| | | | |
|---|---|---|---|
| 2004/0169012 A1* | 9/2004 | Carpenter et al. | 216/83 |
| 2004/0241896 A1* | 12/2004 | Zhou et al. | 438/48 |
| 2005/0048414 A1 | 3/2005 | Harnack et al. | |
| 2006/0021533 A1* | 2/2006 | Jeans | 101/327 |
| 2007/0145632 A1 | 6/2007 | Peeters et al. | |

FOREIGN PATENT DOCUMENTS

| | | |
|---|---|---|
| WO | WO 00/00868 | 1/2000 |
| WO | WO 03/031136 A | 4/2003 |
| WO | WO 2005/101466 A2 | 10/2005 |
| WO | WO 2006/047215 A2 | 5/2006 |
| WO | WO 2008/024207 A | 2/2008 |

OTHER PUBLICATIONS

Delamarche Emmanuel et al.: "Microcontact Printing using Poly(Dimethylsiloxane) Printing Using Poly(Dimethylsiloxane) Stamps Hydrophilized by Poly(Ethylene Oxide) Silanes", Langmuir, ACS, Washington, DC., US, vol. 19, No. 21, Oct. 14, 2003, pp. 8749-8758, XP009077341, ISSN: 0743-7463, Figures 1,5.

Rothrock Ginger Denision et al., "High-Performance Imprint Lithography and Novel Metrology Methods Using Multifunctional Perfluoropolyethers", Proc Spie Int Soc Opt Eng: Proceedings of SPIE—The International Society for Optical Engineering; Metrology, Inspection, and Process Control for Microlithography XX 2006, vol. 6152 II, 2006, XP002489281, p. 2, Paragraph 1.

Truong, et al., "Soft lithography using acryloxy perfluoropolyether composite stamps", Langmuir, vol. 23 (Jan. 2007), pp. 2898-2905.

Gates et al., "New approaches to nanofabrication: molding, printing, and other techniques", vol. 105, No. 4 (Mar. 2005), pp. 1171-1196.

Suh et al., "Bilayer reversal imprint lithography: direct metal-polymer transfer", Nanotechnology, vol. 15 (Jun. 2004), pp. 1103-1107.

U.S. Appl. No. 11/508,806, filed Aug. 23, 2006, Blanchet-Fincher et al.

* cited by examiner

METHOD TO FORM A PATTERN OF FUNCTIONAL MATERIAL ON A SUBSTRATE USING A MASK MATERIAL

BACKGROUND OF THE INVENTION

1. Field of the Invention

This invention pertains to a method for forming a pattern of functional material on a substrate, and in particular, the method uses an elastomeric stamp having a relief surface to form a pattern of open area on the substrate where the functional material is applied.

2. Description of Related Art

Nearly all electronic and optical devices require patterning. Microelectronic devices have long been prepared by photolithographic processes to form the necessary patterns. According to this technique a thin film of conducting, insulating, or semiconducting material is deposited on a substrate and a negative or positive photoresist is coated onto the exposed surface of the material. The resist is then irradiated in a predetermined pattern, and irradiated or non-irradiated portions of the resist are washed from the surface to produce a predetermined pattern of resist on the surface. To form a pattern of a conducting metal material, the metal material that is not covered by the predetermined resist pattern is then etched or removed. The resist pattern is then removed to obtain the pattern of metal material. Photolithography, however, is a complex, multi-step process that is too costly for the printing of plastic electronics.

Microcontact printing is a flexible, non-lithographic method for forming patterned materials. Microcontact printing potentially provides a significant advance over conventional photolithographic techniques since the contact printing can form relatively high resolution patterns on plastic electronics for electronic parts assembly. Microcontact printing can be characterized as a high resolution technique that enables patterns of micron dimensions to be imparted onto a substrate surface. Microcontact printing is also more economical than photolithography systems since it is procedurally less complex, not requiring spin coating equipment or a clean room environment. In addition, microcontact printing potentially lends itself to reel-to-reel electronic parts assembly operations that allows for high throughput production than other techniques, such as photolithography and e-beam lithography (which is a conventional technique employed where resolution on the order of 10 s of nanometer is desired). Multiple images can be printed from a single stamp in reel-to-reel assembly operations using microcontact printing.

Microcontact printing technique is a possible replacement to photolithography in the fabrication of microelectronic devices, such as radio frequency tags (RFID), sensors, and memory and backpanel displays. The capability of microcontact printing to transfer self-assembled monolayers (SAM) forming molecular species to a substrate has also found application in patterned electroless deposition of metals. SAM printing is capable of creating high resolution patterns, but is generally limited to forming metal patterns of gold or silver with thiol chemistry. Although there are variations, in SAM printing a positive relief pattern provided on an elastomeric stamp is inked onto a substrate. The relief pattern of the elastomeric stamp, which is typically made of polydimethyl-siloxane (PDMS), is inked with a thiol material. Typically the thiol material is an alkane thiol material. The substrate is blanket coated with a thin metal film of gold or silver, and then the gold-coated substrate is contacted with the stamp. Upon contact of the relief pattern of the stamp with the metal film, a monolayer of the thiol material having the desired microcircuit pattern is transferred to the metal film. Alkane thiols form an ordered monolayer on metal by a self-assembly process, which results in the SAM being tightly packed and well adhered to the metal. As such, the SAM acts as an etch resist when the inked substrate is then immersed in a metal etching solution and all but the SAM protected metal areas are etched away to the underlying substrate. The SAM is then stripped away leaving the metal in the desired pattern.

A method of transferring a material to a substrate, particularly for light emitting devices, is disclosed by Coe-Sullivan et al. in WO 2006/047215. The method includes selectively depositing the material on a surface of a stamp applicator and contacting the surface of the stamp applicator to the substrate. The stamp applicator may be textured, that is have a surface with a pattern of elevations and depressions, or may be featureless, that is, having no elevations or depressions. The material is a nanomaterial ink, which includes semiconductor nanocrystals. Direct contact printing of the material on the substrate eliminates the steps associated with printing of SAM in which excess material that does not form the desired microcircuitry pattern from the substrate is etched away or removed.

Direct microcontact printing of SAM of thiol materials or other materials such as those described in WO 2006/047215 may be achievable in microelectronic devices and components having a high density of features. However, microcontact printing of devices and components having the pattern of fine resolution lines of functional material separated by relatively large featureless areas where no functional material resides can be problematic. The stamp can sag in areas between features where the density of features is low or the separation of between features is large. Sagging of the relief surface of the stamp is a phenomenon in which a lowermost surface of recessed areas of the relief structure collapse or sag toward an uppermost surface of the raise areas. Sagging may also be called roof collapse of the stamp. Sagging of the relief surface can cause the recessed areas to print material where there should be no material. The recessed areas sag into contact sufficient to transfer material onto the substrate in undesired regions that are not a part of the pattern of lines being formed. Sagging of the recessed areas of the stamp can even be exacerbated when pressure is applied to the stamp. Pressure on the stamp is sometimes necessary in order to achieve transfer of the material pattern to the substrate. If the material transferred is large, it may contact one or more of the pattern lines of the functional material, which can destroy the use of the component. Microcontact printing of conductive patterns, particularly using SAM layers, where the sagging of the stamp transfers material onto background areas can lead to shorting the devices or components.

In addition to the feature density pattern incorporated in the stamp, the elastic nature of stamp may contribute to sagging in featureless areas. The stamp used for microcontact printing is elastomeric in order for the stamp to sufficiently contact the substrate while conforming to various surfaces including on cylindrical or spherical surfaces, or discontinuous or multiplanar surfaces. However the features of the stamp may have an aspect ratio (determined by the width of features divided by height of features on the stamp) such that sagging is caused in the recessed areas between the pattern of fine resolution line features.

So it is desirable to provide a method for forming a pattern of a functional material, such as a conductor, semiconductor, or dielectric material, onto a substrate. It is also desirable for such method to have the ease of microcontact printing with an elastomeric stamp, but not be limited to printing onto metals. It is also desirable for such a method to avoid the problem of transfer of the functional material in featureless areas of the pattern.

SUMMARY OF THE INVENTION

The present invention provides a method to form a pattern of functional material on a substrate. The method includes providing an elastomeric stamp having a raised surface in a relief structure with a mask material on at least the raised surface of the relief structure and transferring the mask material from the raised surface to the substrate to form a pattern of open area on the substrate. The method includes applying the functional material to the open area on the substrate thereby forming an exterior surface of functional material opposite the substrate, contacting an adhesive to the exterior surface of the functional material, and separating the adhesive from the substrate to remove at least the mask material from the substrate.

DESCRIPTION OF THE PREFERRED EMBODIMENT(S)

Throughout the following detailed description, similar reference characters refer to similar elements in all figures of the drawings.

The present invention provides a method to form a pattern of a functional material on a substrate for use in electronic applications. The method is applicable to the pattern formation of a variety of electronic materials, including conductors, semiconductors, and dielectrics, as the functional material. The method is not limited to the application by elastomeric stamps of thiol materials as a mask material. The method is capable of forming the pattern of the functional material onto a variety of substrates over large areas typically with at least 1 to 5 micron line resolution, and thus is particularly capable of forming microcircuitry. The method employs the ease of printing with an elastomeric stamp having a relief structure to transfer a mask material, without sagging or substantial sagging of the stamp and undesired transfer of material to the substrate. The method provides clean, open featureless background area between the lines of functional material, while retaining image fidelity and resolution associated with conventional microcontact printing. The method can be adapted to high-speed production processes for the fabrication of electronic devices and components, such as reel-to-reel processes.

A stamp is provided for patterning a substrate. The stamp includes a relief structure with a raised surface. Typically the relief structure will include a plurality of raised surfaces and a plurality of recessed surfaces. The relief structure of the stamp forms a pattern of raised surfaces for printing a mask material on a substrate. The pattern of the mask material on the substrate is the opposite or the negative of a pattern of the functional material desired for the electronic component or device. That is, the recessed surfaces of the relief structure of the elastomeric stamp represent the pattern of the function material that will ultimately be formed on the substrate by the present method, and the raised surfaces represent the background or featureless areas on the substrate. In one embodiment, the present method primarily avoids the problem of stamp sagging (i.e., roof collapse in the recessed portions) associated with standard microcontact printing due to the structure of the relief surface of the stamp. The raised surfaces of the stamp structure are relatively wide compared to the width of the recessed surfaces. Due to the relatively narrow dimension width of the recessed surfaces, elastomeric stamps formed and used by the present invention do not sag or substantially sag in the recessed surfaces and undesirably transfer material. The stamp prints from the raised surface/s the relatively wide lines of the mask material that will represent open background area on the electronic part ultimately formed. In one embodiment, the relief structure of the stamp will have raised surfaces that have widths greater than widths of the recessed surfaces. Although the above described embodiment of the relief structure of the stamp provides particular benefit, the present method is not limited to only embodiments where the raised surface/s has a width greater than the width of the recess surface/s. The present method is applicable to forming patterns of functional material regardless of the relative dimensions of the raised surfaces and the recessed surfaces of the stamp.

The stamp may be formed in conventional fashion as understood by those skilled in the art of microcontact printing. For example, a stamp may be fabricated by molding and curing a layer of a material on a master having a surface presenting a relief form (that is in opposite of the stamp relief structure). The stamp may be cured by exposure to actinic radiation, heating, or combinations thereof. The stamp thus includes a layer of the elastomeric material, which may be referred to as an elastomeric layer, cured layer, or cured elastomeric layer. The stamp may also, for example, be fabricated by ablating or engraving a material in a manner that generates the relief structure. The relief structure of the stamp is such that the raised surface has a height from the recessed surface sufficient for selective contact of the raised surface with a substrate. In one embodiment, the raised surface has a height from the recessed surface of about 0.2 to 20 micron. In another embodiment, the raised surface has a height from the recessed surface of about 0.2 to 2 micron. The stamp may be fabricated from any material that is capable of reproducing by relief printing a pattern of material on a substrate. The material of the stamp is elastomeric in order for at least a raised portion of the stamp to conform to a surface of the substrate so as to promote the complete transfer of the mask material thereto. Polymeric materials are suitable for forming the elastomeric stamp and are not limited to include, for example, silicone polymers, such as polydimethylsiloxane (PDMS); epoxy polymers, polymers of conjugated diolefin hydrocarbons, including polyisoprene, 1,2-polybutadiene, 1,4-polybutadiene, and butadiene/acrylonitrile; elastomeric block copolymers of an A-B-A type block copolymer, where A represents a non-elastomeric block, preferably a vinyl polymer and most preferably polystyrene, and B represents an elastomeric block, preferably polybutadiene or polyisoprene; acrylate polymers; and fluoropolymers. Examples of A-B-A block copolymers include but is not limited to poly(styrene-butadiene-styrene) and poly(styrene-isoprene-styrene). The polymeric material may be elastomeric or may become elastomeric upon curing.

In one embodiment, the material forming the elastomeric stamp is photosensitive such that the relief structure can be formed upon exposure to actinic radiation. The term "photosensitive" encompasses any system in which the photosensitive composition is capable of initiating a reaction or reactions, particularly photochemical reactions, upon response to actinic radiation. Upon exposure to actinic radiation, chain propagated polymerization of a monomer and/or oligomer is induced by either a condensation mechanism or by free radical addition polymerization. While all photopolymerizable mechanisms are contemplated, photosensitive compositions useful as elastomeric stamp material will be described in the context of free-radical initiated addition polymerization of monomers and/or oligomers having one or more terminal ethylenically unsaturated groups. In this context, the photoinitiator system when exposed to actinic radiation can act as a source of free radicals needed to initiate polymerization of the monomer and/or oligomer.

The composition is photosensitive since the composition contains a compound having at least one ethylenically unsaturated group capable of forming a polymer by photoinitiated addition polymerization. The photosensitive composition may also contain an initiating system activated by actinic radiation to induce photopolymerization. The polymerizable compound may have non-terminal ethylenically unsaturated groups, and/or the composition may contain one or more other components, such as a monomer, that promote crosslinking. As such, the term "photopolymerizable" is intended to encompass systems that are photopolymerizable, photocrosslinkable, or both. As used herein, photopolymerization may also be referred to as curing. The photosensitive composition forming the elastomeric stamp may include one or more constituents and/or additives, and can include, but is not limited to photoinitiators, one or more ethylenically unsaturated compounds (which may be referred to as monomers), fillers, surfactants, thermal polymerization inhibitors, processing aids, antioxidants, photosensitizers, and the like to stabilize or otherwise enhance the composition.

The photoinitiator can be any single compound or combination of compounds, which is sensitive to actinic radiation, generating free radicals which initiate the polymerization without excessive termination. Any of the known classes of photoinitiators, particularly free radical photoinitiators such as aromatic ketones, quinones, benzophenones, benzoin ethers, aryl ketones, peroxides, biimidazoles, benzyl dimethyl ketal, hydroxyl alkyl phenyl acetophone, dialkoxy actophenone, trimethylbenzoyl phosphine oxide derivatives, aminoketones, benzoyl cyclohexanol, methyl thio phenyl morpholino ketones, morpholino phenyl amino ketones, alpha halogennoacetophenones, oxysulfonyl ketones, sulfonyl ketones, oxysulfonyl ketones, sulfonyl ketones, benzoyl oxime esters, thioxanthrones, camphorquinones, ketocouumarins, and Michler's ketone may be used. In one embodiment, the photoinitiator can include a fluorinated photoinitiator that is based on known fluorine-free photoinitiators of the aromatic ketone type. Alternatively, the photoinitiator may be a mixture of compounds, one of which provides the free radicals when caused to do so by a sensitizer activated by radiation. Liquid photoinitiators are particularly suitable since they disperse well in the composition. Preferably, the initiator is sensitive to ultraviolet radiation. Photoinitiators are generally present in amounts from 0.001% to 10.0% based on the weight of the photosensitive composition.

Monomers that can be used in the composition activated by actinic radiation are well known in the art, and include, but are not limited to, addition-polymerization ethylenically unsaturated compounds. The addition polymerization compound may also be an oligomer, and can be a single or a mixture of oligomers. The composition can contain a single monomer or a combination of monomers. The monomer compound capable of addition polymerization can be present in an amount less than 5%, preferably less than 3%, by weight of the composition.

In one embodiment the elastomeric stamp is composed of a photosensitive composition that includes a fluorinated compound that polymerizes upon exposure to actinic radiation to form a fluorinated elastomeric-based material. Suitable elastomeric-based fluorinated compounds include, but are not limited to, perfluoropolyethers, fluoroolefins, fluorinated thermoplastic elastomers, fluorinated epoxy resins, fluorinated monomers and fluorinated oligomers that can be polymerized or crosslinked by a polymerization reaction. In one embodiment, the fluorinated compound has one or more terminal ethylenically unsaturated groups that react to polymerize and form the fluorinated elastomeric material. The elastomeric-based fluorinated compounds can be homopolymerized or copolymerized with polymers such as polyurethanes, polyacrylates, polyesters, polysiloxanes, polyamides, and others, to attain desired characteristics of the printing form precursor and/or the stamp suitable for its use. Exposure to the actinic radiation is sufficient to polymerize the fluorinated compound and render its use as a printing stamp, such that application of high pressure and/or elevated temperatures above room temperature is not necessary. An advantage of compositions containing fluorinated compounds that cure by exposure to actinic radiation is that the composition cures relatively quickly (e.g., in a minutes or less) and has a simple process development, particularly when compared to compositions that thermally cure such as PDMS based systems.

In one embodiment, the elastomeric stamp includes a layer of the photosensitive composition wherein the fluorinated compound is a perfluoropolyether (PFPE) compound. A perfluoropolyether compound is a compound that includes at least a primary proportion of perfluoroether segments, i.e., perfluoropolyether. The primary proportion of perfluoroether segments present in the PFPE compound is equal to or greater than 80 weight percent, based on the total weight of the PFPE compound. The perfluoropolyether compound may also include one or more extending segments that are hydrocarbons or hydrocarbon ethers that are not fluorinated; and/or, are hydrocarbons or hydrocarbon ethers that may be fluorinated but are not perfluorinated. In one embodiment, the perfluoropolyether compound includes at least the primary proportion of perfluoropolyether segments and terminal photoreactive segments, and optionally extending segments of hydrocarbon that are not fluorinated. The perfluoropolyether compound is functionalized with one or more terminal ethylenically unsaturated groups that render the compound reactive to the actinic radiation (i.e., photoreactive segments). The photoreactive segments may also be referred to as photopolymerizable segments.

The perfluoropolyether compound is not limited, and includes linear and branched structures, with linear backbone structures of the perfluoropolyether compound being preferred. The PFPE compound may be monomeric, but typically is oligomeric and a liquid at room temperature. The perfluoropolyether compound may be considered an oligomeric difunctional monomer having oligomeric perfluoroether segments. Perfluoropolyether compounds photochemically polymerize to yield the elastomeric layer of the stamp. An advantage of the PFPE based materials is that PFPEs are highly fluorinated and resist swelling by organic solvents, such as methylene chloride, chloroform, tetrahydrofuran, toluene, hexanes, and acetonitrile among others, which are desirable for use in microcontact printing techniques.

Optionally, the elastomeric stamp may include a support of a flexible film, and preferably a flexible polymeric film. The flexible support is capable of conforming or substantially conforming the elastomeric relief surface of the stamp to a printable electronic substrate, without warping or distortion. The support is also sufficiently flexible to be able to bend with the elastomeric layer of the stamp while peeling the stamp from the master. The support can be any polymeric material that forms a film that is non-reactive and remains stable throughout conditions for making and using the stamp. Examples of suitable film supports include cellulosic films such as triacetyl cellulose; and thermoplastic materials such as polyolefins, polycarbonates, polyimides, and polyester. Preferred are films of polyethylene, such as polyethylene terephthalate and polyethylene napthalate. Also encompassed within a support is a flexible glass. Typically the support has a thickness between 2 to 50 mils (0.0051 to 0.13 cm). Typically the support is in sheet form, but is not limited to this form. In one embodiment, the support is transparent or substantially transparent to the actinic radiation at which the photosensitive composition polymerizes.

Optionally, the elastomeric stamp may include one or more layers on the relief surface prior to the application of the mask material. The one or more layers may, for example, assist in the transfer of the mask material from the stamp to the substrate. An example of a material suitable for use as the additional layer includes fluorinated compounds. In one embodiment, the additional layer remains with the elastomeric stamp after transfer of the mask material to the substrate.

A mask material is provided on the stamp by applying the mask material to at least the raised surface of the relief structure of the stamp. The mask material can be applied to the stamp by any suitable method, including but not limited to, injection, pouring, liquid casting, jetting, immersion, spraying, vapor deposition, and coating. Examples of suitable methods of coating include spin coating, dip coating, slot coating, roller coating, and doctor blading. In one embodiment, the mask material is applied to the relief structure of the stamp, that is, the mask material forms a layer on the raised surface/s and the recessed surface/s. The layer of mask material on the stamp can be continuous or discontinuous. The thickness of the layer of mask material is not particularly limited, provided that the material can print and function as a mask on the substrate. In one embodiment, the thickness of the mask material layer is typically less than the relief height (difference between the raised surface and the recessed surface) of the stamp. In one embodiment, the layer of mask material on the stamp is between 0.01 and 1 microns.

After the mask material has been applied to at least the raised surface of the stamp, the mask material may optionally be dried to remove some or all of a carrier or solvent prior to transferring to the substrate. Drying may be accomplished in any manner, including, using gas jets, blotting with an absorbent material, evaporation at room temperature or an elevated temperature, etc. In one embodiment the mask material is substantially free of solvent or carrier before transferring and forms a film on the raised surface.

The selection of mask material is driven by the functional material that will ultimately be patterned. The mask material is typically dispersed or dissolved or suspended in solution for application to the stamp. The functional material is also typically dispersed or dissolved or suspended in solution for application to the substrate. The type of solution used for the functional material, whether an organic or aqueous or alcohol based compound, determines the mask material and the corresponding solution that the mask material is dispersed or dissolved or suspended in. The mask material should not use the same or substantially the same or similar solution that the functional material uses. The solution may be a solvent, that is a substance which is capable of dissolving another substance to form a uniformly dispersed mixture, or may be a carrier compound capable of dispersing or suspending the material in solution sufficient to conduct the steps of the present method.

In particular embodiments, the solution for the mask material is incompatible or substantially incompatible with the solution of the functional material. That is, in one embodiment if the functional material is in solution with an organic compound, the mask material is selected to be incompatible or substantially incompatible with organic solutions, (i.e., the mask material is dispersed or dissolved or suspended in aqueous or alcohol solution). In one embodiment, if the functional material is in solution with an aqueous or alcohol compound, the mask material is selected to be incompatible or substantially incompatible with aqueous or alcohol solutions, (i.e., the mask material is dispersed or dissolved or suspended in an organic material). In one embodiment, the mask material and the functional material are incompatible or substantially incompatible, such that the functional material when applied on the pattern of mask material on the substrate, does not or substantially does not alter or disrupt or otherwise impact the pattern of mask material. In another embodiment, the mask material and the functional material are incompatible or substantially incompatible such that the functional material and the mask material do not intermingle or dissolve when adjacent to one another. Examples of altering or disrupting the pattern include dissolving or swelling the mask material and lifting the mask material from the substrate (when in contact with the functional material); and dissolving or swelling the functional material and lifting of the functional material from the substrate. It is also contemplated within the bounds of the present method that the mask material and the functional material both may use the same generic solution, e.g., both use an organic solution, or both use an alcohol solution, and still be incompatible or substantially incompatible. In this case provided that the solubility of the mask material solution and the functional material solution are different enough that the application of the functional material does not detrimentally impact the pattern of mask material on the substrate, and the removal of the mask material does not detrimentally impact the formation of the pattern of functional material, the mask material and the functional material are considered substantially incompatible. The mask material should be capable of (1) forming a layer on at least the raised surface of the relief structure of stamp; (2) transferring a pattern according to the relief structure to the substrate; and (3) removing from the substrate without detrimentally impacting the pattern of functional material (and without impacting an underlying layer, if present). Certain properties of the elastomeric stamp, may influence the capability of a particular mask material to form a layer and transfer to the substrate, but it is well within the skill of those in the art of microcontact printing to determine an appropriate combination of mask material and elastomeric stamp. In one embodiment, the mask material also allows the functional material to cover in whole or in part the mask pattern.

Materials suitable as the mask material are not limited provided that the mask material meets the above requirements. Examples of materials suitable for use as the mask material for functional materials that are in aqueous or water solution, include but are not limited to, acrylonitrile homopolymers and copolymers, such as acrylonitrile-butadiene elastomers, and poly(acrylonitrile); styrene homopolymers and copolymers, such as, polystyrene, and poly(styrene-acrylonitrile) copolymers; homopolymers and copolymers of acrylates and methacrylates, such as polyacrylate, poly(ethyl methacrylate), and polymethacrylate; polycarbonates; polyurethanes; polythiophenes; substituted and unsubstituted polyphenylene-vinylene homopolymers and copolymers; poly(4-vinyl pyridine); poly(n-hexyl isocyanate); poly(1,4-phenylene vinylene); epoxy-based systems; poly(n-carbazole); homopolymers and copolymers of polynorbornene; poly(phenylene oxide); poly(phenylene sulfide); poly(tetrafluoroethylene); and combinations and copolymers thereof.

Examples of materials suitable for use as the mask material for functional materials that are in organic solution, include but are not limited to, alkyd resins; gelatin; poly(acrylic acid); polypeptides; proteins; poly(vinyl pyridine); poly(vinyl pyrrolidone); hydroxy polystyrene; poly(vinyl alcohol); polyethylene glycol; chitosan; poly(styrene-co-vinyl pyridine); poly(butyl acrylate-co-vinyl pyridine); aryl amines and fluorinated aryl amines; cellulose and cellulose derivatives; dispersions of acrylate and/or methacrylate emulsions; and combinations and copolymers thereof.

Transferring the mask material from the raised surface of the relief structure to the substrate creates a pattern of the mask material on the substrate and correspondingly forms a pattern of open area on the substrate. Transferring may also be referred to as printing. Contacting the mask material on the raised surface to the substrate transfers the mask material, such that the pattern of mask material forms when the stamp is separated from the substrate. In one embodiment, all or substantially all the mask material positioned on the raised surface(s) transfer to the substrate. The separation of the stamp from the substrate may be accomplished by any suitable means, including but not limited to peeling, gas jets, liquid jets, mechanical devices etc.

Optionally pressure may be applied to the stamp to assure contact and complete transfer of the mask material to the substrate. Suitable pressure used to transfer the mask material to the substrate is less than 5 lbs./cm$^2$, preferably less than 1 lbs./cm$^2$, more preferably 0.1 to 0.9 lbs./cm$^2$, and most preferably about 0.5 lbs./cm$^2$. Transfer of the mask material to the substrate may be accomplished in any manner. Transferring the mask material may be by moving the relief surface of the stamp to the substrate, or by moving the substrate to the relief surface of the stamp, or by moving both the substrate and the relief surface into contact. In one embodiment, the mask material is transferred manually. In another embodiment, the transfer of the mask material is automated, such as, for example, by a conveyor belt; reel-to-reel process; directly-driven moving fixtures or pallets; chain, belt or gear-driven fixtures or pallets; a frictional roller; printing press; or a rotary apparatus. The thickness of the layer of masking material is not particularly limited, with typical thickness of the layer of mask material on the substrate between 100 to 10000 angstrom (0.001 to 1 micrometer).

The substrate is not limited, and can include, plastic, polymeric films, metal, silicon, glass, fabric, paper, and combinations thereof, provided that the mask pattern can be formed thereon. The substrate can be opaque or transparent. The substrate can be rigid or flexible. The substrate may include one or more layers and/or one or more patterns of other materials, before the pattern of the functional material according to the present method is formed on the substrate. A surface of the substrate can include an adhesion-promoting surface, such as a primer layer, or can be treated to promote adhesion of an adhesive layer, or the masking material, or functional material to the substrate. Optionally, the substrate can include an adhesive layer to aid in the transfer of the mask material from the stamp to the substrate, and/or to aid in balancing cohesive force between the mask material and the substrate and between the functional material and the substrate relative to cohesive strength of an adhesive used to remove the mask material from the substrate. In one embodiment, the adhesive has a glass transition temperature above room temperature. By heating the substrate having an adhesive layer above room temperature, the adhesive layer can soften or become tacky and aid in the adhesion of the mask material to the substrate. The substrate need not have any treatment or adhesive layers, provided that there is a sufficient difference in the surface energy of the stamp and the substrate to drive the transfer of mask material to the substrate, and that there is a sufficiently strong adhesive attraction between the substrate and the functional material to resist removal of the functional material from the substrate upon separation of the adhesive from the substrate.

Suitable substrates include, for example, a metallic film on a polymeric, glass, or ceramic substrate, a metallic film on a conductive film or films on a polymeric substrate, metallic film on a semiconducting film on a polymeric substrate. Further examples of suitable substrates include, for example, glass, indium-tin-oxide coated glass, indium-tin-oxide coated polymeric films; polyethylene terephthalate, polyethylene naphthalate, polyimides, silicon, and metal foils.

After the pattern of mask material is formed on the substrate, the functional material is applied to the substrate, in at least the open area or areas between the mask pattern. In one embodiment, the functional material is applied to cover the surface of the substrate, that is, over the mask pattern and the open area/s on the substrate. In another embodiment, the functional material is applied selectively to cover at least the open area or areas on the substrate (where no pattern of mask material resides). Selective application of the functional material can be carried out by jetting, for example. The functional material can be applied to the substrate by any suitable method, including but not limited to, injection, pouring, liquid casting, jetting, immersion, spraying, vapor deposition, and coating. Examples of suitable methods of coating include spin coating, dip coating, slot coating, roller coating, and doctor blading.

After the functional material has been applied to the substrate, the functional material can be dried to remove some or all of the carrier or solvent prior to removal of the mask pattern from the substrate. Drying may be accomplished in any manner, including, using gas jets, blotting with an absorbent material, evaporation at room temperature or an elevated temperature, etc. In one embodiment, the functional material is substantially free of solvent or carrier and forms a film on the surface of the substrate.

A functional material is a material that is patterned for use in microfabrication of electronic components and devices. The functional material is not limited, and includes, for example, conductive materials, semi-conductive materials, dielectric materials, etc. Examples of conductive materials for use as a functional material include, but are not limited to, indium-tin oxide; metals, such as silver, gold, copper, and palladium; metal complexes; metal alloys; etc. Examples of semiconductive materials include, but are not limited to, silicon, germanium, gallium arsenide, zinc oxide, and zinc selenide.

The functional material can be of any form including particulate, polymeric, molecular, etc. Typically, semiconducting materials and dielectric materials are polymeric, but are not limited to this form, and functional materials can include soluble semiconducting molecules.

Functional materials for use in the present method also include nanoparticles of conductive, semi-conductive, and dielectric materials. Nanoparticles are microscopic particles whose size is measured in nanometers (nm). Nanoparticles include particles having at least one dimension less than 200 nm. In one embodiment, the nanoparticles have a diameter of about 3 to 100 nm. At the small end of the size range, the nanoparticles may be referred to as clusters. The shape of the nanoparticles is not limited and includes nanospheres, nanorods, and nanocups. Nanoparticles made of semiconducting material may also be called quantum dots, if the particles are small enough (typically less than 10 nm) that quantization of electronic energy levels occurs. Semiconducting materials include light-emitting quantum dots. A bulk material generally has constant physical properties regardless of its size, but for nanoparticles this is often not the case. Size dependent properties are observed such, as quantum confinement in semiconductor particles, surface plasmon resonance in some metal particles and superparamagnetism in magnetic materials. The functional material includes but is not limited to semi-solid nanoparticles, such as liposome; soft nanoparticles; nanocrystals; hybrid structures, such as core-shell nanoparticles. The functional material includes nanoparticles of carbon, such as carbon nanotubes, conducting carbon nanotubes, and semiconducting carbon nanotubes. Metal nanoparticles and dispersions of gold, silver and copper are commercially available from Nanotechnologies, and ANP.

In one embodiment, the functional material is in solution for application to the substrate. In another embodiment, the functional material is liquid and need not be in solution for application to the substrate. The functional material, particularly when in the form of nanoparticles, is suspended in a carrier system. As was described above in one embodiment, the solvent or carrier system for the functional material should be incompatible or substantially incompatible with the mask material transferred onto the substrate.

In one embodiment, the functional material is applied to at least the open area on the substrate, forming an exterior surface opposite the substrate that is composed of the pattern of mask material and a correspondingly opposite pattern of the functional material. In another embodiment, the functional material is applied on the substrate, forming an exterior surface composed of a layer functional material contiguous with the pattern of mask material and the open area on the substrate. After the functional material is applied to the substrate, at least the pattern of mask material is removed from the substrate by contacting an adhesive to the exterior surface and separating the adhesive from the substrate to transfer the mask material from the substrate. The adhesive has sufficient strength to overcome adhesive force at an interface between the mask material and the substrate and transfer the mask material from the substrate, but not so much strength as to overcome adhesive force at an interface between the functional material and the substrate and transfer the pattern of functional material, upon separation of the adhesive from the substrate. If the substrate includes an adhesive layer as described above, the adhesive used for removing the mask material should have sufficient strength to overcome adhesive force between the mask material and the substrate adhesive layer, but not so much strength to overcome adhesive force between the functional material and the substrate. In one embodiment, the adhesive should be in intimate contact with the exterior surface. Contact can be at least physical touching between the adhesive and the exterior surface. Contact can also encompass bonding of the adhesive to the exterior surface. One embodiment for contacting is by simply placing a layer of the adhesive adjacent the exterior surface of the substrate, with or without manually applying pressure. Another embodiment for contacting is by laminating the adhesive to the exterior surface under pressure and/or heat. Another embodiment for contacting is by pulling a vacuum between the adhesive and the exterior surface of the substrate. Yet another embodiment for contacting is by exposing the adhesive to radiation, e.g., ultraviolet, while adjacent to the exterior surface. The actinic radiation being capable of causing bonding of the adhesive to the exterior surface. In one embodiment, the adhesive is capable of removing all of the mask material at once by contacting the exterior surface and separating from the substrate. In another embodiment, the steps of contacting the exterior surface and separating from the substrate are repeated 2 or more times to sufficiently remove the mask material from the substrate.

In one embodiment, the tack of the adhesive determines the strength of the adhesive. Tack is a property of the adhesive material that enables the material to form a bond of (measurable) strength immediately upon contact with another surface, usually with low applied pressure. Tack is thus instantaneous or substantially instantaneous adhesion. Tack of an adhesive is a function of rheological properties as well as tensile strength or cohesion, yield value, modulus of elasticity, and rate of elastic recovery. Tack of an adhesive can be sensitive to variations in temperature, pressure, rate of application, removal of pressure and contact time. In most cases, the tack of the adhesive will determine the suitable strength of an adhesive to remove at least the mask material. In another embodiment, a period of time may be necessary to for the adhesive to develop its ultimate strength suitable to at least remove the mask material.

Materials suitable as the adhesive are not limited. The adhesive can have sufficient adhesive strength at end-use conditions, or can be activated by any suitable means including heat, radiation, pressure, or combinations thereof. Examples of adhesives include, but are not limited to, starch-based adhesives (e.g., polysaccharides), cellulosics, rubbers, butyl rubber, polyisobutylene, nitrile rubber, carboxylic polymers, neoprene, phenolic resins, resorcinolic materials, epoxy resins, vinyl acetate emulsions, vinyl acetate-ethylene copolymers, aromatic polyimides, polyamides, polyacrylates, polymethacrylates, polyolefins, polyurethanes, polyisobutylenes, polystyrenes, polyvinyl resins, polyester resins, poly(acrylic acids), and copolymers, mixtures, and blends of these and other polymers. Further examples of adhesives can be found in "Handbook of Adhesives", edited by 1. Skeist, second edition, Van Nostrand Reinhold Company, New York, 1977. The adhesive layer has a thickness between about 10 to 500 nanometer. In one embodiment, the thickness of the adhesive layer is between 50 to 250 nm. In another embodiment, the thickness of the adhesive layer is between 50 to 150 nm. In another embodiment, the thickness of the adhesive layer is between 10 to 80 nm. An adhesive composition that includes the adhesive and other components, such as for example, fillers, tackifiers, plasticizers, curing agents, emulsifiers, thickeners, stabilizers, etc., can be used as the adhesive material for removing at least the mask material.

In one embodiment, a layer of the adhesive is applied to a support to form a material capture element. The adhesive layer can be applied by any suitable means, and can cover in whole or in part one side of the support. The support for the adhesive layer is not limited and can include any of the optional supports that were described above as suitable for the elastomeric stamp. (Note that the adhesive layer with the support does not need to be elastomeric.) The material capture element can be in any form including sheet, web, and cylindrical.

The material capture element and the substrate are oriented such that the adhesive layer of the material capture element contacts the exterior surface of the substrate, that is, the adhesive layer contacts the layer of functional material, or, the adhesive layer contacts the pattern of mask material and the corresponding pattern of functional material. An assemblage of the material capture sheet and the substrate can be formed by any means suitable to assure sufficient contact between the exterior surface and the adhesive material, so that the adhesive removes at least the mask material upon separation. One embodiment for a method for forming the assemblage is by laminating the material capture element and the substrate together under pressure and/or heat, by sending the assemblage through a laminating device consisting of, for example, two rolls, or a roll and a platen. Another embodiment for the method for forming the assemblage is by creating a vacuum between the adhesive and the exterior surface of the substrate. Another embodiment for the method for forming assemblage is by simply placing together the material capture element adjacent the substrate, with or without manually applying pressure.

Separating the material capture element from the substrate causes at least the mask material to transfer or be carried away with the adhesive, and thus removes the mask material from the substrate. The material capture element can be separated from the substrate by any means including mechanically or manually peeling, stripping, lifting, etc. the support with the adhesive layer away from the substrate. In one embodiment, the adhesive directly contacts the mask material and upon separation removes the mask material from the substrate. In another embodiment, the adhesive contacts the functional material covering the pattern of mask material, and upon separation removes the mask material and the functional material that covers the mask material. In another embodiment, the functional material that covers the mask pattern may be removed in a separate step from the removal of the mask material. For example, the functional material that covers the mask pattern may first be removed using a first material capture sheet having a layer of an adhesive that has sufficient strength to adhere to and carry away the functional material that breaks at an interface between the functional material and the mask material (but not so much strength as to overcome the adhesive force between the functional material and the substrate (or the underlying layer of material on the substrate)). The pattern of mask material can then be removed with a second material capture element having a layer of an adhesive that has sufficient strength (e.g., adhesive force) to adhere to and carry away the mask material that breaks at an interface between the mask material and the substrate (or the underlying layer of material on the substrate). As another example, the functional material that covers the mask pattern may first be removed by placing the substrate in a suitable bath, and then the pattern of mask material is removed by contact adhesion to the material capture element. Removal of the mask material should not disrupt or disturb the functional material that is in contact with the substrate (or with an underlying layer that is not the mask material). If the application of the functional material formed a layer on the substrate over both the mask pattern and the open area/s on the substrate, the removal of the mask pattern (and the overlying functional material) results in the formation of the pattern of the functional material on the substrate.

Although the present method can be used to form any pattern layer of an electronic device or component, the method is particularly useful to form an initial pattern of the functional material. In substrates having more than one additional layers underlying the presently applied functional material, care must be taken in choosing the adhesive to remove the mask material such that the underlying layers are not impacted or disrupted by separation.

Optionally, the substrate having the pattern of functional material may undergo further treatment steps such as, heating, exposing to actinic radiation sources such as ultraviolet radiation and infrared radiation, subjecting to a stream of gas to which a high voltage is applied at atmospheric conditions (e.g., plasma treating), subjecting to gas plasma treatment in reduced pressure atmosphere (e.g., glow discharge), etc. The treating step can occur after or just prior to the removing step. In an embodiment where the functional material is in the form of nanoparticles, the additional treatment step may be necessary to render the functional material operative. For instance, when the functional material is composed of metal nanoparticles, the pattern of functional material must be heated to anneal or sinter the particles and render the lines of the pattern conductive.

Figure 1:
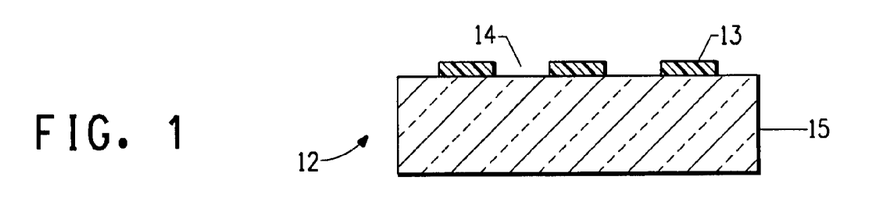
FIG. 1 is a sectional elevation view of a master having a relief structure that forms a pattern of a microcircuit or other functional electronic pathway.
Figure 2:
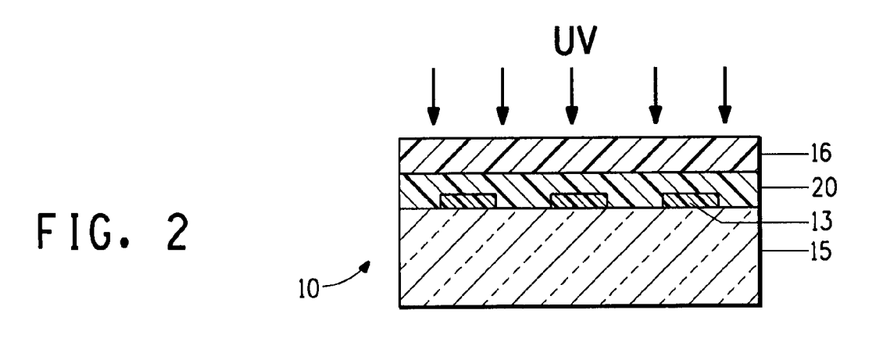
FIG. 2 is a sectional elevation view of one embodiment of a printing form precursor having a layer of an elastomeric material between a support and the master, the elastomeric layer being exposed to actinic radiation.
Figure 3:
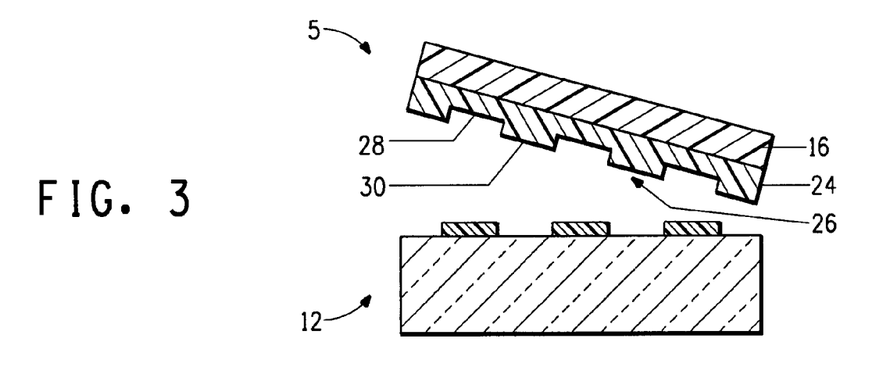
FIG. 3 is a sectional elevation view of a stamp formed from the printing form precursor separating from the master. The stamp has a relief structure corresponding to the relief pattern of the master, and in particular, the relief structure of the stamp includes a pattern of at least a raised surface and a recessed surface that is the opposite of the relief pattern of the master.

Referring to FIGS. 1 through 3, one embodiment of a method of preparing a stamp 5 from a stamp precursor 10 occurs in a molding operation. FIG. 1 depicts a master 12 having a pattern 13 of a negative relief of the microelectronic features formed on a surface 14 of a master substrate 15. The master substrate 15 can be any smooth or substantially smooth metal, plastic, ceramic or glass. In one embodiment the master substrate is a glass or silicon plane. Typically the relief pattern 13 on the master substrate 15 is formed of a photoresist material, according to conventional methods that are well within the skill in the art. Plastic grating films and quartz grating films can also be used as masters. If very fine features on the order of nanometers are desired, masters can be formed on silicon wafers with e-beam radiation.

The master 12 may be placed in a mold housing and/or with spacers (not shown) along its perimeter to assist in the formation of a uniform layer of the photosensitive composition. The process to form the stamp can be simplified by not using the mold housing or spacers.

In one embodiment shown in FIG. 2, a photosensitive composition is introduced to form a layer 20 onto the surface of the master 12 having the relief pattern 13. The photosensitive composition can be introduced on to the master 12 by any suitable method, including but not limited to, injection, pouring, liquid casting and coating. In one embodiment, the photosensitive composition is formed into the layer 20 by pouring the liquid onto the master. The layer of the photosensitive composition 20 is formed on the master 12 such that after exposure to actinic radiation, the cured composition forms a solid elastomeric layer having a thickness of about 5 to 50 micron. A support 16 is positioned on a side of the photosensitive composition layer 20 opposite the master 12 such that an adhesive layer if present, is adjacent the layer of the photosensitive composition, to form the stamp precursor 10. The support 16 can be applied to the composition layer in any manner suitable to attain the stamp precursor 10. Upon exposure to actinic radiation, which is ultraviolet radiation in the embodiment shown, through the transparent support 16 of the stamp precursor 10, the photosensitive layer 20 polymerizes and forms an elastomeric layer 24 of the composition for the stamp 5. The layer of the photosensitive composition 20 cures or polymerizes by exposure to actinic radiation. Further, typically the exposure is conducted in a nitrogen atmosphere, to eliminate or minimize the presence of atmospheric oxygen during exposure and the effect that oxygen may have on the polymerization reaction.

The printing form precursor can be exposed to actinic radiation, such as an ultraviolet (UV) or visible light, to cure the layer 20. The actinic radiation exposes the photosensitive material through the transparent support 16. The exposed material polymerizes and/or crosslinks and becomes a stamp or plate having a solid elastomeric layer with a relief surface corresponding to the relief pattern on the master. In one embodiment, suitable exposure energy is between about 10 and 20 Joules on a 365 nm I-liner exposure unit.

Actinic radiation sources encompass the ultraviolet, visible, and infrared wavelength regions. The suitability of a particular actinic radiation source is governed by the photosensitivity of the photosensitive composition, and the optional initiator and/or the at least one monomer used in preparing the stamp precursor. The preferred photosensitivity of stamp precursor is in the UV and deep visible area of the spectrum, as they afford better room-light stability. Examples of suitable visible and UV sources include carbon arcs, mercury-vapor arcs, fluorescent lamps, electron flash units, electron beam units, lasers, and photographic flood lamps. The most suitable sources of UV radiation are the mercury vapor lamps, particularly the sun lamps. These radiation sources generally emit long-wave UV radiation between 310 and 400 nm. Stamp precursors sensitive to these particular UV sources use elastomeric-based compounds (and initiators) that absorb between 310 to 400 nm.

As shown in FIG. 3, the stamp 5, which includes the support 16, is separated from the master 12 by peeling. The support 16 on the stamp 5 is sufficiently flexible in that the support and the stamp can withstand the bending necessary to separate from the master 12. The support 16 remains with the cured elastomeric layer 24 providing the stamp 5 with the dimensional stability necessary to reproduce micropatterns and microstructures associated with soft lithographic printing methods. The stamp 5 includes on a side opposite the support 16 a relief surface 26 having recessed surfaces 28 and raised surfaces 30 corresponding to the negative of the relief pattern 13 of the master 12. The relief surface 26 has a difference in height between the raised portion 30 and the recessed portion 28, that is a relief depth. The relief structure 26 of the stamp 5 forms a pattern of raised surfaces 30 for printing a mask material 32 on a substrate 34 and recessed surface portions 28 which will not print.

Figure 4:
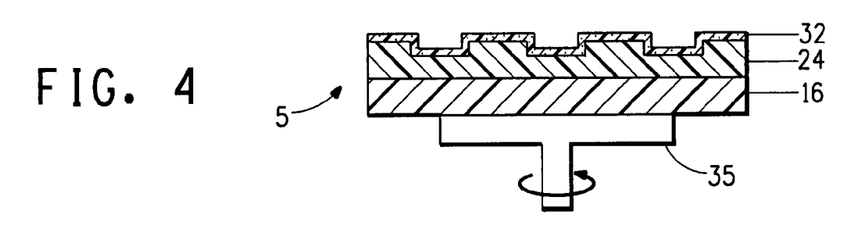
FIG. 4 is a sectional elevation view of the elastomeric stamp residing on a platform of a spin coater as one embodiment of applying a mask material to the relief structure of the stamp.

In FIG. 4, the stamp 5 resides on a platform 35 of a spin coating device as one embodiment for applying the mask material 32 onto the relief structure 26 of the stamp 5. The mask material 32 is applied to the relief structure 26 of the stamp 5 and the platform is rotated to form a relatively uniform, continuous layer of the mask material.

Figure 5:
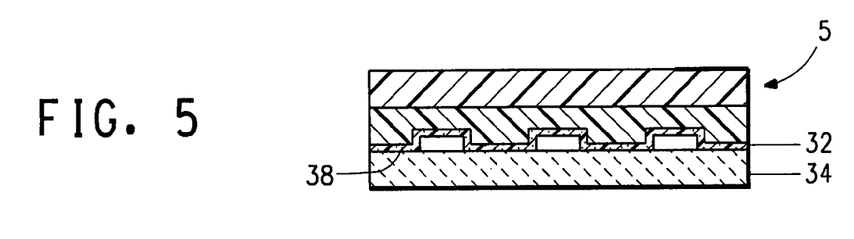
FIG. 5 is a sectional elevation view of the elastomeric stamp having the layer of mask material on the raised surface of the relief structure contacting a substrate.

In FIG. 5, the stamp 5 having the layer of mask material 32 and the substrate 34 are positioned adjacent one another so that the mask material on the raised surfaces 30 of the stamp 5 contact a surface 38 of the substrate 34.

Figure 6:
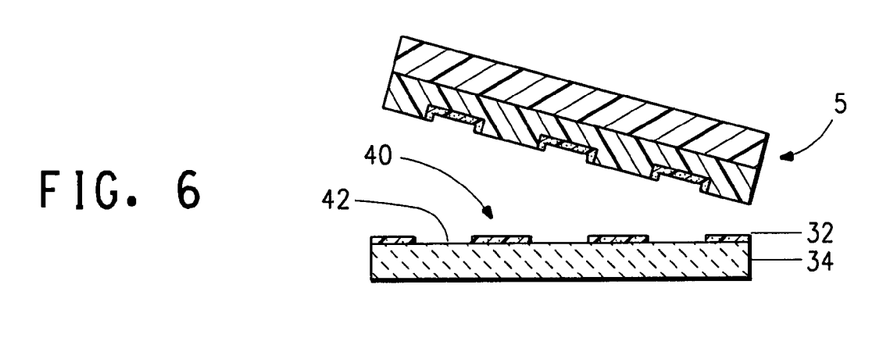
FIG. 6 is a sectional elevation view of the elastomeric stamp separating from the substrate, and transferring the mask material on the raised surface to the substrate to form a pattern of mask material.

In FIG. 6, the stamp 5 is separated from the substrate 34, and the mask material 32 contacting the substrate remains on the substrate, transferring to form a pattern 40 of the mask material. The substrate 34 includes the pattern 40 of mask material 32 and open areas 42 where no mask material resides.

Figure 7:
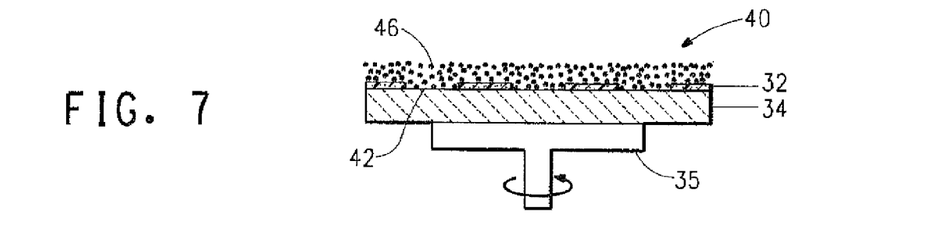
FIG. 7 is a sectional elevation view of the substrate with the pattern of mask material on a platform of a spin coater as one embodiment of applying a functional material to open areas on the substrate that are not covered by the pattern of mask material.

In FIG. 7, the substrate 34 with mask pattern 40 resides on the platform 35 of a spin coating device as one embodiment for applying a functional material 46 to the substrate. The functional material 46 is applied to a side of the substrate 34 having the mask pattern 40, and the platform 35 is rotated to form a relatively uniform, continuous layer of the functional material 46 on the substrate. In the embodiment shown, the layer of functional material 46 covers both the pattern 40 of mask material 32 and the open areas 42.

Figure 8:
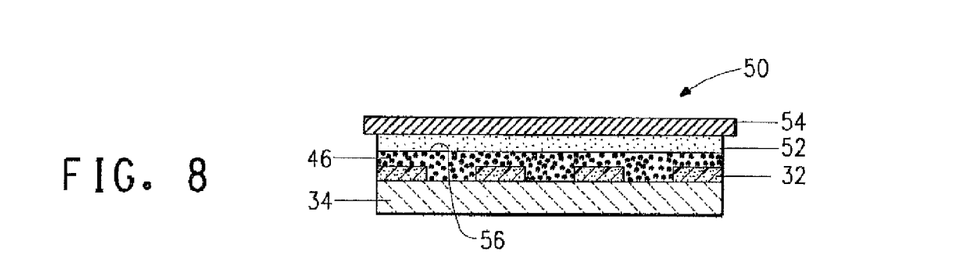
FIG. 8 is a sectional elevation view of the substrate with the functional material and the mask material and a material capture element having a layer of an adhesive showing contacting of the adhesive to an exterior surface of the mask material and functional material.

In FIG. 8 a material capture element 50 having a layer of the adhesive 52 on a support 54 is placed adjacent the substrate 34 so that the adhesive layer contacts an exterior surface 56 of the substrate having the layer of the functional material 46 and the mask pattern 40.

Figure 9:
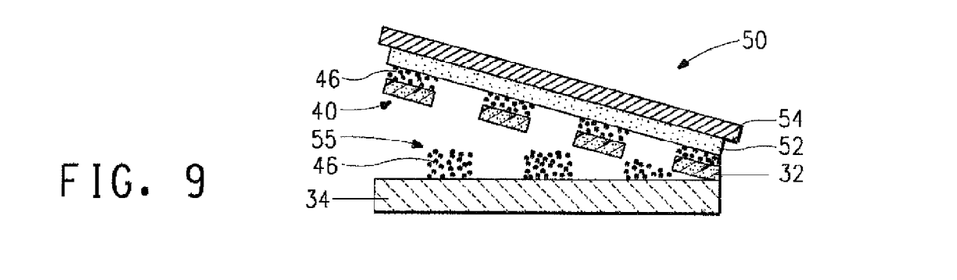
FIG. 9 is a sectional elevation view of the substrate with the pattern of the functional material showing separating the material capture element from the substrate to remove the mask material and form a pattern of the functional material on the substrate.

In FIG. 9, the material capture element 50 is peeled away from the substrate 34 and the adhesive layer 52 carries the functional material 46 covering the mask material and the mask pattern 40. The functional material 46 that resided in the open areas 42 remains on the substrate 34. The functional material 46 that resides on the substrate 34 in the open areas 42 creates a pattern 55 of functional material 46 for the electronic device or component.

EXAMPLES

Unless otherwise indicated, all percentages are by weight of the total composition.

Example 1

The following example demonstrates a method to form a pattern on a substrate using an elastomeric stamp to print a mask material. Silver nanoparticles were formed into a pattern onto a flexible base that can provide a functional source-drain level of a thin film transistor.

Master Preparation:

A thin hexamethyldisilazane layer (HMDS) (from Aldrich) was spun coated onto a 2 inch (5.1 cm) silicon wafer at 3000 rpm for 60 seconds. HMDS is an adhesion promoter for a photoresist material on a silicon wafer. A Shipley photoresist, type 1811 (from Rohm and Haas) was spun coated onto the HMDS layer at 3000 rpm for 60 seconds. The photoresist film was pre-baked on the hotplate at 115° C. for 1 minute to complete drying. The pre-baked photoresist film was then imagewise exposed to ultraviolet radiation of 365 nm for 8 seconds in an I-liner (OAI Mask Aligner, Model 200). After exposure the photoresist was developed in developer type MF-319 (from Rohm and Haas) that is tetramethyl ammonium hydroxide (TMAH) solution for 60 seconds. The developed film washed in distilled water, dried with nitrogen, and heated on the hotplate to 115° C. for 5 minutes, to form the master with a relief pattern. The relief pattern on the prepared master had raised surface areas and recessed areas. The raised surface areas in the master form a positive image that will be the pattern of the functional silver material formed on the substrate. The thickness of the layer of the patterned photoresist master was 1.1 microns as measured with a surface Profiler (KLA-Tencor, San Jose, Calif.). The HMDS remained in the recessed areas on the master.

Elastomeric Stamp Preparation:

A support for the elastomeric stamp was prepared by applying a layer of a UV curable optically-clear adhesive, type NOA73, (purchased from Norland Products; Cranbury, N.J.) at a thickness of 5 microns onto a 5 mil (0.0127 cm) Melinex® 561 polyester film support by spin coating at 3000 rpm and then curing by exposure to ultraviolet radiation (350-400 nm) at 1.6 watts power (20 mWatt/cm$^2$) for 90 seconds in a nitrogen environment.

A perfluoropolyether (PFPE) compound, D20-DA was supplied by Sartomer as product code NTX7068 and was used as received. The D20-DA has the following structure Where X and X' are H, and m and n, which designate the number of randomly distributed perfluoromethyleneoxy ($CF_2O$) and perfluoroethyleneoxy ($CF_2CF_2O$) backbone repeating subunits, is such that the PFPE compound has a molecular weight of about 2000 based on a number average. The D20-DA is identified as a PFPE diacrylate prepolymer.

A fluorinated photoinitiator having the resulting structure was prepared according to the following reaction.

Fluorinated photoinitiator

| Compound | Structure | Molar Mass (g) | Reaction Mass (g) | Moles | Volume (mL) | Equiv. |
|---|---|---|---|---|---|---|
| Alpha-hydroxymethylbenzoin | $C_{15}H_{14}O_3$ | 242.27 | 20.00 | 0.083 | | 1.00 |
| HFPO-dimer acid fluoride | $C_6F_{12}O_2$ | 332.044 | 32.89 | 0.099 | | 1.20 |
| Methylene Chloride | | | | | 100 | |
| Freon-113 | | | | | 60 | |
| Triethylamine | $Et_3N$ | 101.19 | 8.35 | 0.083 | | 1.00 |
| Product | $C_{21}H_{13}F_{11}O_5$ | 554.307 | 45.76 | 0.083 | | |

Procedure to Prepare the Fluorinated Photoinitiator:

To a 500 mL round bottom flask was added α-hydroxymethylbenzoin (20.14 g), triethylamine (Fluka, 8.40 g) and methylene chloride (100 mL). The mixture was magnetically stirred under positive nitrogen pressure at room temperature. To a separate flask was added HFPO dimer acid fluoride (32.98 g) and Freon-113 ($CFCl_2CF_2Cl$, Aldrich, 60 mL). The acid fluoride solution was added dropwise to the stirring α-hydroxymethylbenzoin solution at 4-5° C. over 30 minutes in order to control the exothermic reaction. The reaction pot stirred for 2.5 hrs at room temperature after the addition was complete.

The reaction washed with 4×500 mL saturated NaCl solution. The organic layer was dried over $MgSO_4$ and filtered over a celite/methylene chloride pad. TLC analysis indicated a small amount of starting material remained in the crude product. The product was concentrated in vacuo and then dissolved in hexanes (100 mL). This solution was pre-absorbed onto silica gel and washed through a silica column using 90:10 hexanes:EtOAc eluent. The desired product was isolated as a light yellow oil which was a mixture of diastereomers (33 g, 72% yield).

The elastomeric stamp composition was prepared by mixing the PFPE diacrylate prepolymer (MW 2000) and 1% by weight of the fluorinated photoinitiator. The mixture was filtered using a 0.45 micrometer PTFE filter. The filtered prepolymer was poured to form a layer on the side of the prepared master having the relief pattern. The support was placed on the PFPE pre-polymer layer opposite the master (air-layer interface), such that the adhesive was in contact with the layer. The PFPE layer was exposed through the support using the 365 nm I-liner (17 mW/cm$^2$) for 10 minutes under a nitrogen atmosphere, to cure or polymerize the PFPE layer and form a stamp. The stamp was then peeled from the master and had a relief surface that was the opposite of the relief pattern in the master. Thus the relief surface on the stamp was the negative of the desired pattern of functional material. (The stamp had raised surface areas and recessed areas, in which the recessed surface areas correspond to the pattern of silver that will ultimately be formed.)

Transfer of Mask Material:

A mask material of 0.5% by weight solution of Covion Super-Yellow™, a substituted polyphenylene-vinylene 1-4 copolymer, (from Merck) was dissolved in toluene and filtered using a 1.5 micron PTFE filter. The mask material solution was spun coated onto the relief surface of the prepared PFPE stamp at 3000 rpm for 60 seconds. The solution covered the entire relief surface, and was allowed to dry in air at room temperature for about 1 minute. The substrate, a 5 mil Melinex® film type ST504, was placed on a hotplate maintained at 65° C. The PFPE stamp having the layer of the mask material was laminated onto an acrylic side of the substrate (while on the hotplate) without applying any additional pressure. The stamp and the substrate were removed from the hotplate, and the stamp was separated from the substrate at room temperature. The mask material on the raised surface of the relief pattern of the elastomeric stamp transferred to the substrate and formed a mask pattern on the substrate. Recessed areas in the stamp did not contact the substrate, and therefore the substrate had open areas where there was no mask material. The pattern of masking material had a thickness of 27 nm as measured with a profiler. The mask pattern of the printed sacrificial masking material was the positive of the pattern of the pattern on the master.

Patterning of Functional Material:

A silver ink with 45% solids type DGP-MP-40LT was purchased from ANP Co. Ltd. (Korea). The silver ink had silver nanoparticles of 50 nm diameter. The ink was diluted to 17% by weight with ethanol. The diluted silver dispersion was then sonicated for 5 minutes with a tip sonicator and filtered twice with a 0.2 micron PTFE filter. The silver dispersion was spun coated onto the substrate having the pattern of the mask material at 3000 rpm for 60 seconds. The entire surface of the substrate was covered by the silver dispersion, that is, the silver material was deposited as a layer on the mask pattern and the open areas. The silver was then annealed at 65° C. for 1 minute to remove the solvent and sintered at 140° C. for 5 minutes on a hotplate.

A material capture element having a layer of an adhesive was prepared by coating a polymeric latex having a glass transition temperature of 60° C. on a flexible film, 5 mil Melinex® film type ST504. The polymeric latex, 33% by weight solids was prepared by emulsion polymerization of 10% of glycidyl methacrylate, 2% of methyl acrylic acid, 80% of butyl methacrylate, and 8% of methylmethacrylate. The polymeric latex was an aqueous solution, and was diluted to 6.6% solids by adding 5 times of distilled water by weight and followed by filtering through 0.45 micron PTFE filter. Before spin coating, the coated side of ST504 film was oxygen plasma treated for 15 sec using Plasma Preen Cleaner (Terra Universal, Inc., Fullerton, Calif. 92831) and washed with isopropyl alcohol, acetone, and distilled water, and dried using a nitrogen gun. The diluted latex solution was spin coated onto the ST504 film at 300 rpm for 60 sec. The spun-coated latex film on ST504 was annealed at 130° C. for 5 min in a convection oven. The adhesive layer had a thickness of ~100 nm and a roughness of ~5 nm.

The substrate with the pattern of mask material and the layer of the silver functional material was placed on a hotplate at 65° C. The material capture element was oriented so that the adhesive latex layer was adjacent and in contact with the layer of the silver functional material, and then manually laminated with even pressure to form an assemblage. A rubber mat was placed on top of the material capture element and a bar was rolled manually on the rubber mat to laminate the element to the substrate.

The material capture element was then peeled away from the substrate, delaminating the assemblage, removing the mask material from the substrate and forming the pattern of the silver functional material on the substrate. The adhesive layer of the material capture element carried away the silver that resided on the mask material and the pattern of mask material together. The adhesive layer did not remove the silver functional material residing on the substrate, and the pattern of silver remained on the substrate.

Although the silver material was uniformly coated forming a layer onto the mask material, a high resolution silver pattern was created on the substrate. The pattern comprised interdigitated 5 microns lines that were separated by 2 micron spaces.

The silver pattern lines had a resistivity of less than 2 ohm/sq.

Patterning by this method lead to source drain lines without breaks or undesired particulate. There was no undesired transfer of the silver onto nominally clean background area and the thickness of the silver pattern were even at about 80 nm regardless of the pattern size. The edges of the lines were well defined similar to those that could be obtained by photolithographic methods.

What is claimed is:

1. A method to form a pattern of functional material on a substrate comprising:
   a) providing an elastomeric stamp having a relief structure with a raised surface;
   b) applying a mask material to at least the raised surface of the relief structure;
   c) transferring the mask material from the raised surface to the substrate forming a pattern of open area on the substrate;
   d) applying the functional material to at least the open area on the substrate, thereby forming an exterior surface of functional material opposite the substrate;
   e) contacting an adhesive to the exterior surface of the functional material; and
   f) separating the adhesive from the substrate to remove at least the mask material from the substrate;
wherein the applying step forms a layer of functional material covering both the open area and the mask material, the method further comprising contacting another adhesive to the exterior surface, wherein the separating step first removes only the functional material covering the mask material.

2. The method of claim 1 further comprising activating the adhesive by exposing the adhesive to the group consisting of radiation, heat, pressure, and combinations thereof.

3. The method of claim 1 wherein the contacting step comprises providing vacuum contact between the adhesive and the exterior surface.

4. The method of claim 1 wherein the contacting step comprises laminating the adhesive to the exterior surface.

5. The method of claim 3 wherein laminating is conducted at an elevated temperature, under pressure, or a combination thereof.

6. The method of claim 1 wherein the contacting step further comprises exposing the adhesive to radiation capable of bonding the adhesive to the exterior surface, while the adhesive is adjacent the exterior surface.

7. The method of claim 1 wherein the adhesive is selected from the group consisting of starch-based adhesives, cellulosics, rubbers, butyl rubber, polyisobutylene, nitrile rubber, carboxylic polymers, neoprene, phenolic resins, resorcinolic materials, epoxy resins, vinyl acetate emulsions, vinyl acetate-ethylene copolymers, aromatic polyimides, polyamides, polyacrylates, polymethacrylates, polyolefins, polyurethanes, polyisobutylenes, polystyrenes, polyvinyl resins, polyester resins, poly(acrylic acids), and copolymers and blends of these and other polymers.

8. The method of claim 1 further comprising forming a material capture element comprising a layer of the adhesive on a support.

9. The method of claim 1 wherein the adhesive forms a layer having a thickness between about 10 to 500 nanometer.

10. The method of claim 1 wherein the functional material is in solution, the method further comprising drying to form a film of the functional material on the substrate.

11. The method of claim 1 wherein the functional material is selected from the group consisting of conductors, semiconductors, dielectrics, and combinations thereof.

12. The method of claim 1 wherein the functional material comprises nanoparticles.

13. The method of claim 11 wherein the nanoparticles are selected from the group consisting of conductors, dielectrics, semiconductors, and combinations thereof.

14. The method of claim 11 wherein the nanoparticles comprise a metal selected from the group consisting of silver, gold, copper, palladium, indium-tin oxide, and combinations thereof.

15. The method of claim 11 wherein the nanoparticles are semiconducting nanoparticles selected from the group consisting of silicon, germanium, gallium arsenide, zinc oxide, zinc selenide, and combinations thereof.

16. The method of claim 11 wherein the nanoparticles are selected from the group consisting of carbon nanotubes, conducting carbon nanotubes, semiconducting carbon nanotubes, and combinations thereof.

17. The method of claim 1 wherein the functional material comprises nanoparticles of metal in a liquid carrier, the method further comprising heating the nanoparticles on the substrate.

18. The method of claim 1 wherein the step d) of applying the functional material is selected from the group consisting of injecting, pouring, liquid casting, jetting, immersion, spraying, vapor deposition, and coating.

19. The method of claim 1 wherein the mask material comprises a polymeric material in a liquid, the method further comprising removing the liquid sufficiently to form a film of the mask material on at least the raised surface.

20. The method of claim 1 wherein the mask material is in solution, the method further comprising drying to form a layer of the mask material on the raised surface of the stamp.

21. The method of claim 1 wherein the mask material on the substrate has a thickness between 100 and 10000 angstrom.

22. The method of claim 1 wherein the mask material is selected from the group consisting of acrylonitrile-butadiene elastomers; poly(acrylonitrile); styrene homopolymers and copolymers; homopolymers and copolymers of acrylates and methacrylates; polycarbonates; polyurethanes; polythiophenes; substituted and unsubstituted polyphenylene-vinylene homopolymers and copolymers; poly(4-vinyl pyridine); poly(n-hexyl isocyanate); poly(1,4-phenylene vinylene); epoxy-based systems; poly(n-carbazole); homopolymers and copolymers of polynorbornene; poly(phenylene oxide); poly(phenylene sulfide); poly(tetrafluoroethylene); alkyd resins; gelatin; poly(acrylic acid); polypeptides; proteins; poly(vinyl pyridine); poly(vinyl pyrolidone); hydroxy polystyrene; poly(vinyl alcohol); polyethylene glycol; chitosan; poly(styrene-co-vinyl pyridine); poly(butyl acrylate-co-vinyl pyridine); aryl amines and fluorinated aryl amines; cellulose and cellulose derivatives; dispersions of acrylate and/or methacrylate emulsions; and combinations and copolymers thereof.

23. The method of claim 1 wherein the elastomeric stamp comprises a layer of a composition selected from the group consisting of silicone polymers; epoxy polymers; polymers of conjugated diolefin hydrocarbons; elastomeric block copolymers of an A-B-A type block copolymer, where A represents a non-elastomeric block and B represents an elastomeric block; acrylate polymers; fluoropolymers, and combinations thereof.

24. The method of claim 1 further comprising forming the elastomeric stamp from a layer of a photosensitive composition.

25. The method of claim 1 further comprising forming the elastomeric stamp from a layer of a composition containing a fluorinated compound capable of polymerization by exposure to actinic radiation.

26. The method of claim 25 wherein the fluorinated compound is a perfluoropolyether compound.

27. The method of claim 1 wherein the elastomeric stamp comprises a layer of a composition capable of curing by heating.

28. The method of claim 1 wherein the elastomeric stamp further comprises a support of a flexible film.

29. The method of claim 1 wherein the substrate is selected from the group consisting of plastic, polymeric films, metal, silicon, glass, fabric, paper, and combinations thereof.

* * * * *